(12) United States Patent
Park et al.

(10) Patent No.: US 9,318,168 B2
(45) Date of Patent: Apr. 19, 2016

(54) MEMORY SYSTEM FOR CONTINUOUSLY MAPPING ADDRESSES OF A MEMORY MODULE HAVING DEFECTIVE LOCATIONS

(71) Applicant: Samsung Electronics Co., Ltd., Suwon-Si, Gyeonggi-Do (KR)

(72) Inventors: Chul-Woo Park, Yongin-si (KR); Dong-Soo Kang, Hwaseong-si (KR); Su-A Kim, Seongnam-si (KR); Jun-hee Yoo, Ansan-si (KR); Hak-Soo Yu, Seongnam-si (KR); Jae-Youn Youn, Seoul (KR); Sung-hyun Lee, Gwangju-si (KR); Kyoung-Heon Jeong, Suwon-si (KR); Hyo-Jin Choi, Suwon-si (KR); Young-Soo Sohn, Seoul (KR)

(73) Assignee: Samsung Electronics Co., LTD., Gyeonggi-do (KR)

( * ) Notice: Subject to any disclaimer, the term of this patent is extended or adjusted under 35 U.S.C. 154(b) by 109 days.

(21) Appl. No.: 14/090,510

(22) Filed: Nov. 26, 2013

(65) Prior Publication Data

US 2014/0149652 A1 May 29, 2014

Related U.S. Application Data

(60) Provisional application No. 61/730,143, filed on Nov. 27, 2012.

(30) Foreign Application Priority Data

Mar. 15, 2013 (KR) .................... 10-2013-0027867

(51) Int. Cl.
*G06F 12/02* (2006.01)
*G11C 7/10* (2006.01)
*G11C 29/00* (2006.01)

(52) U.S. Cl.
CPC .......... *G11C 7/1072* (2013.01); *G06F 12/0223* (2013.01); *G06F 12/0292* (2013.01); *G11C 29/76* (2013.01); *G11C 29/84* (2013.01)

(58) Field of Classification Search
CPC ..................... G06F 12/0292; G06F 12/0223
USPC ................................... 711/105, 202
See application file for complete search history.

(56) References Cited

U.S. PATENT DOCUMENTS

| 6,414,885 B2 | 7/2002 | Nagamatsu et al. |
| 2002/0141264 A1 | 10/2002 | Mori et al. |
| 2003/0090943 A1 | 5/2003 | Okuyama et al. |
| 2003/0213988 A1 | 11/2003 | Tsujino |

(Continued)

FOREIGN PATENT DOCUMENTS

| JP | 2002-123431 A | 4/2002 |
| JP | 2008-107897 A | 5/2008 |

(Continued)

*Primary Examiner* — Than Nguyen
(74) *Attorney, Agent, or Firm* — Harness, Dickey & Pierce, P.L.C.

(57) ABSTRACT

In one example embodiment, a memory system includes a memory module and a memory controller. The memory module is configured generate density information of the memory module based on a number of the bad pages of the memory module, the bad pages being pages that have a fault. The memory controller is configured to map a continuous physical address to a dynamic random access memory (dram) address of the memory module based on the density information received from the memory module.

17 Claims, 14 Drawing Sheets

(56) References Cited

U.S. PATENT DOCUMENTS

| | | |
|---|---|---|
| 2004/0062086 A1 | 4/2004 | Watanabe |
| 2005/0149687 A1* | 7/2005 | Adelmann .................... 711/170 |
| 2005/0283657 A1 | 12/2005 | Nishihara |
| 2009/0013148 A1* | 1/2009 | Eggleston .................... 711/203 |
| 2010/0085825 A1 | 4/2010 | Keeth et al. |
| 2010/0251041 A1 | 9/2010 | Miyazaki et al. |

FOREIGN PATENT DOCUMENTS

| | | |
|---|---|---|
| JP | 2011-044188 A | 3/2011 |
| KR | 1999-000721 B1 | 12/1999 |

* cited by examiner

MEMORY SYSTEM FOR CONTINUOUSLY MAPPING ADDRESSES OF A MEMORY MODULE HAVING DEFECTIVE LOCATIONS

PRIORITY STATEMENT

This US non-provisional application claims the benefit of priority under 35 USC §119 to U.S. Provisional Application No. 61/730,143 filed on Nov. 27, 2012 in the USPTO, and Korean Patent Application No. 10-2013-0027867 filed on Mar. 15, 2013 in the Korean Intellectual Property Office (KIPO), the contents of each of which are herein incorporated by reference in their entirety.

BACKGROUND

1. Technical Field

Example embodiments of the present inventive concepts relate to a memory field. More particularly, example embodiments of the present inventive concepts relate to a memory system and/or a method of mapping an address using the memory system.

2. Description of the Related Art

As a scaling of a memory device such as a dynamic random access memory ("DRAM") has continued, a memory system guaranteeing a preset density in a possible target range of yield rate has been developed instead of guaranteeing a full density by replacement of a redundancy cell.

In the memory system guaranteeing a preset density, the memory has a normal cell area guaranteeing a continuous address and a replacement cell area for replacing a bad page having a fault. Thus, an available density of the memory substantially decreases.

Particularly, in a memory system such as a package on package (PoP), a single inline package (SiP), a dual inline package (DIMM), a method of mapping a physical address or a dram address not to access an unavailable cell area is required by realizing the unavailable cell area.

When memories having decreased density are stacked in a memory stack structure, a hole is generated between available addresses so that the memory system cannot provide a continuous address.

SUMMARY

Some example embodiments of the present inventive concepts provide a memory system mapping a discontinuous address area to a continuous address.

Some example embodiments of the present inventive concepts also provide a method of mapping an address using the memory system.

In one example embodiment, a memory system includes a memory module and a memory controller. The memory module is configured generate density information of the memory module based on a number of the bad pages of the memory module, the bad pages being pages that have a fault. The memory controller is configured to map a continuous physical address to a dynamic random access memory (dram) address of the memory module based on the density information received from the memory module.

In yet another example embodiment, when the memory module includes a memory device and the memory device includes a plurality of banks, the memory module is configured to generate the density information based on a maximum number, the maximum number being a number of the bad pages of one of the plurality of banks having a highest number of the bad pages among the plurality of banks.

In yet another example embodiment, when a full address of the memory module is X, the number of the banks is N and the maximum number is max(a), the maximum of the physical address is X−N*max(a).

In yet another example embodiment, the memory controller is configured to map the continuous physical address to a mapping sequence of the memory module, the mapping sequence being at least one of a row address, a bank address and a column address.

In yet another example embodiment, when a full address of the memory module is X, the number of the banks is N and numbers of the bad pages of the banks are a1 to aN, the maximum of the physical address may be $$X - \sum_{i=1}^{N} ai.$$

In yet another example embodiment, the memory controller is configured to map the continuous physical address to a mapping sequence of the memory module, the mapping sequence being at least one of a bank address, a row address and a column address.

In yet another example embodiment, the memory controller is configured map the continuous physical address to the dram address by adding a page offset value corresponding to the number of the bad pages to the dram address.

In yet another example embodiment, the memory module includes a plurality of memory devices and the density information is generated based on a maximum number, the maximum number being a number of the bad pages of one of the plurality of memory devices having a highest number of the bad pages among the plurality of memory devices.

In yet another example embodiment, when a full address of the memory module is X, the number of the memory devices is M and the maximum number is max(Da), the maximum of the physical address may be X−M*max(Da).

In yet another example embodiment, when a full address of the memory module is X, the number of the memory devices is M and numbers of the bad pages of the memory devices are Da1 to DaM, the maximum of the physical address may be $$X - \sum_{i=1}^{M} Dai.$$

In yet another example embodiment, the memory controller is further configured to output the maximum physical address to a processing architecture running an operating system.

In one example embodiment, a method includes generating density information of a memory package based on a number of the bad page associated with the memory package, the bad pages being pages that have a fault, and mapping a continuous physical address to a dynamic random access memory (dram) address of the memory package based on the density information received from the memory package.

In yet another example embodiment, when the memory package includes a memory device and the memory device includes a plurality of banks, the generating generates the density information based on a maximum number, the maximum number being a number of the bad pages of one of the plurality of banks having a highest number of the bad pages among the plurality of banks.

In yet another example embodiment, when a full address of the memory package is X, the number of the banks is N and the maximum number is max(a), the maximum of the physical address may be X−N*max(a).

In yet another example embodiment, when a full address of the memory package is X, the number of the banks is N and numbers of the bad pages of the banks are a1 to aN, the maximum of the physical address may be $$X - \sum_{i=1}^{N} ai.$$

In one example embodiment, a memory system includes a memory module and a memory controller and a processing architecture in communication with the memory module, at least one of the memory controller and the processing architecture configured to map a continuous physical address to the memory module based on memory density information of the memory module, the memory density information indicating bad pages of the memory module.

In yet another example embodiment, the memory module is configured to determine the bad pages from among pages of the memory module, the bad pages being pages that have a fault and replace each of the bad pages with a normal page in the memory module. The memory module is further configured to generate the memory density information of the memory system based on a number of the determined bad pages and transmit the generated memory density information to at least one of the memory controller and the processing architecture.

In yet another example embodiment, the memory module includes at least one memory device, the at least one memory device including at least one memory bank and the memory module is configured to generate the memory density information based on a maximum number, the maximum number being a number of the bad pages associated with one of the at least one memory bank having a highest number of the bad pages among the at least one memory bank.

In yet another example embodiment, the processing architecture is configured to map the continuous physical address to the memory module by mapping a continuous virtual address to the physical address of the memory controller based on the generated memory density information and mapping the continuous physical address of the memory controller to an address of a cell array of the memory module.

In yet another example embodiment, the at least one of the memory controller and the processing architecture is configured to map the continuous physical address to the address of the memory module by determining an address of an unallocated area of the memory module based on the number of the bad pages, mapping an initial segment of the continuous physical address to an initial segment of the address of the unallocated area of the memory module in a parallel manner until reaching at least one bad area corresponding to at least one bad page of the memory module, skipping the at least one bad area and mapping at least one further segment of the physical address to at least one further segment of the address of the unallocated area of the memory module.

In yet another example embodiment, if the memory module has more than one bad area, the at least one of the memory controller and the processing architecture is further configured to repeat the skipping and the mapping at least one further segment until reaching a maximum of the continuous physical address allowed to be mapped to the memory module.

In yet another example embodiment, the memory controller is configured to determine the maximum of the continuous physical address allowed to be mapped to the memory module based on a full address of the memory module, a number of banks of the memory module and a maximum number, the maximum number being a number of the bad pages of one of the banks of the memory module having a highest number of the bad pages among the banks.

In yet another example embodiment, the memory controller is configured to determine the maximum of the continuous physical address by subtracting from the full address, a result of multiplication of the number of banks and the maximum number.

BRIEF DESCRIPTION OF THE DRAWINGS

The above and other features and advantages of the present inventive concepts will become more apparent by describing in detailed example embodiments thereof with reference to the accompanying drawings, in which.

DETAILED DESCRIPTION OF EXAMPLE EMBODIMENTS

Figure 1:
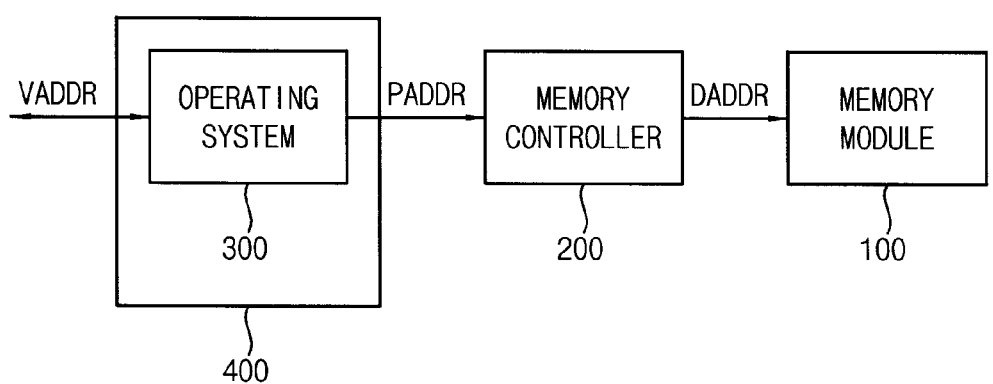
FIG. 1 is a block diagram illustrating a memory system and a processing architecture in communication with the memory system, according to an example embodiment of the present inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present inventive concepts will be explained in detail with reference to the accompanying drawings.

FIG. 1 is a block diagram illustrating a memory system and a processing architecture in communication with the memory system according to an example embodiment of the present inventive concept.

Referring to FIG. 1, the memory system includes a memory module 100 and a memory controller 200. The memory system is connected to a processing architecture 400. The processing architecture 400 may run an operating system 300. In one example embodiment, the processing architecture 400 may incorporate the memory system.

The memory module 100 includes a memory device. According to example embodiments, the memory device may be a dynamic random access memory ("DRAM"). For example, the DRAM may be one of Double Data Rate Synchronous Dynamic Random Access Memory (DDR SDRAM), Low Power Double Data Rate (LPDDR) SDRAM, Graphics Double Data Rate (GDDR) SDRAM and Rambus Dynamic Random Access Memory (RDRAM).

The memory device may include a control logic, an address register, a bank control logic, a row address multiplexer, a column address latch, a row decoder, a column decoder, a memory cell array, a sense amplifier unit, an input/output gating circuit and a data input/output buffer.

The memory cell array may include a plurality of bank arrays. For example, the memory cell array includes first to fourth bank arrays. The row decoder may include first to fourth bank row decoders respectively coupled to the first to fourth bank arrays. The column decoder may include first to fourth bank column decoders respectively coupled to the first to fourth bank arrays. The sense amplifier unit may include first to fourth bank sense amplifiers respectively coupled to the first to fourth bank arrays.

The first to fourth bank arrays, the first to fourth bank row decoders, the first to fourth bank column decoders and the first to fourth bank sense amplifiers may form first to fourth banks.

The control logic may control operations of the memory device. For example, the control logic may generate control signals for the memory device to perform a write operation or a read operation. The control logic may include a command decoder which decodes the command signal received from the memory controller 200 through the command pin and a mode register which is used to set an operation mode of the memory device. For example, the command decoder may generate the control signals corresponding to the command signal by decoding a write enable signal (/WE), a row address strobe signal (/RAS), a column address strobe signal (/CAS), a chip select signal (/CS), etc. The control logic may further receive a clock signal (CLK) and a clock enable signal (/CKE) for operating the memory device in a synchronous manner.

The address register may receive the address signal including a bank address, a row address and a column address from the memory controller 200 through the address pin. The address register may provide the bank address to the bank control logic, provide the row address to the row address multiplexer, and provide the column address to the column address latch.

The bank control logic may generate bank control signals in response to the bank address. One of the first to fourth bank row decoders corresponding to the bank address may be activated in response to the bank control signals, and one of the first to fourth bank column decoders corresponding to the bank address may be activated in response to the bank control signals.

The row address multiplexer may receive the row address from the address register and receive the refresh row address from a refresh control circuit. The row address multiplexer may output one of the row address and the refresh row address in response to the refresh signal. A row address output from the row address multiplexer may be applied to the first to fourth bank row decoders.

The activated one of the first to fourth bank row decoders may decode the row address received from the row address multiplexer and activate a word line corresponding to the row address. For example, the activated bank row decoder may apply a word line driving voltage to the word line corresponding to the row address.

The column address latch may receive the column address from the address register and temporarily store the received column address. In some embodiments, in a burst mode, the column address latch may generate column addresses that increment from the received column address. The column address latch may apply the temporarily stored or generated column address to the first to fourth bank column decoders.

The activated one of the first to fourth bank column decoders may decode the column address received from the column address latch and control the input/output gating circuit to output data corresponding to the column address.

The input/output gating circuit may include a circuitry for gating input/output data. The input/output gating circuit may further include an input data mask logic, read data latches for storing data received from the first to fourth bank arrays, and write drivers for writing data to the first to fourth bank arrays.

Data to be read from one bank array of the first to fourth bank arrays may be sensed by a sense amplifier coupled to the one bank array and be stored in the read data latches. The data stored in the read data latches may be provided to the memory controller 200 via the data input/output buffer and the data pin. Data to be written to one bank array of the first to fourth bank arrays may be provided from the memory controller 200 to the data input/output buffer via the data pin. The data provided to the data input/output buffer may be written to the one bank array via the write drivers.

The memory controller 200 controls an operation of the memory module 100. For example, the memory controller 200 writes the data to the memory module 100 and reads the data from the memory module 100.

The memory controller 200 applies an operating command to control an operation of the memory module 100.

The memory controller 200 may include the command pin, the address pin and the data pin.

The command pin of the memory controller 200 is connected to a command pin of the memory module 100 through a command bus.

The address pin of the memory controller 200 is connected to an address pin of the memory module 100 through an address bus.

The data pin of the memory controller 200 is connected to a data pin of the memory module 100 through a data bus.

The memory module 100 has a dram address DADDR representing an address of a cell array of the memory device. The dram address DADDR may include a bank address, a row address and a column address.

The memory module 100 replaces a bad page having a fault with a normal page. The memory module 100 does not include a redundancy cell for the bad page having a fault. When the bad page is generated, a normal page in a full density is used as a replacement page. Thus, as the number of the bad pages increases, a substantial density of the memory module 100 decreases.

In the present example embodiment, the memory module 100 includes a page table using an anti-fuse and the bad page is replaced with the normal page using the page table.

The memory module 100 counts the number of the bad page. The memory module 100 generates a density information of the memory module 100 based on the number of the bad page.

Figure 2:
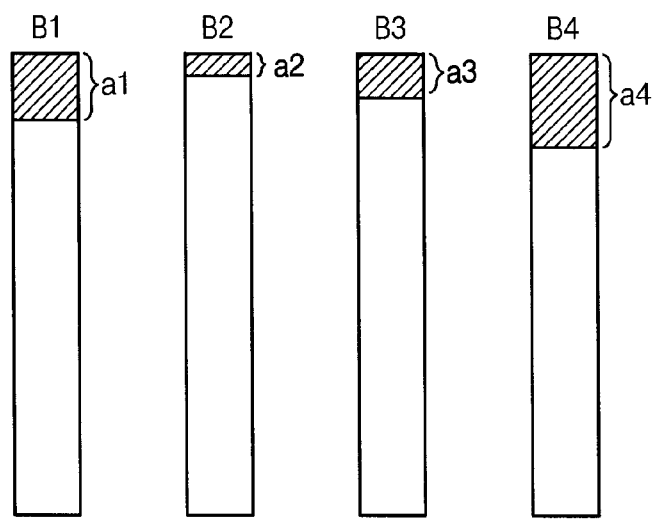
FIG. 2 is a conceptual diagram illustrating bad pages per banks of a memory module of FIG. 1, according to an example embodiment.

A method of determining the density information of the memory module 100 is explained referring to FIG. 2 in detail.

In the present example embodiment, the memory module 100 represents a group of memory devices including a single memory device or a plurality of memory devices. Thus, the memory module 100 may be referred as a memory package 100.

The memory controller 200 receives a physical address PADDR from the operating system 300. The memory controller 200 controls the memory module 100 using the physical address PADDR.

The memory controller 200 receives the density information from the memory module 100. The memory controller 200 maps the physical address PADDR to the dram address DADDR based on the density information.

The operating system 300 controls the memory system using a virtual address VADDR. The operating system 300 maps the virtual address VADDR to the physical address PADDR.

The operating system 300 may include a memory managing unit and a translation lookaside buffer. The memory managing unit converts the virtual address VADDR into the physical address PADDR using the translation lookaside buffer.

FIG. 2 is a conceptual diagram illustrating bad pages per banks of a memory module 100 of FIG. 1.

In the present example embodiment, the memory module 100 includes the single memory device. The memory device includes a plurality of banks. Although the memory device includes four banks in FIG. 2, the present inventive concepts is not limited thereto.

Referring to FIG. 2, a first bank B1 has bad pages corresponding to a1. The first bank B1 has a substantial density less than a full density by a1. When the full density of the first bank B1 is $2^{K1}$, the substantial density of the first bank B1 may be $2^{K1}-a1$. Addresses of the first bank B1 are available from a LSB area or a MSB area by $2^{K1}-a1$.

A second bank B2 has bad pages corresponding to a2. The second bank B2 has a substantial density less than a full density by a2. When the full density of the second bank B2 is $2^{K2}$, the substantial density of the second bank B2 may be $2^{K2}-a2$. Addresses of the second bank B2 are available from a LSB area or a MSB area by $2^{K2}-a2$.

A third bank B3 has bad pages corresponding to a3. The third bank B3 has a substantial density less than a full density by a3. When the full density of the third bank B3 is $2^{K3}$, the substantial density of the third bank B3 may be $2^{K3}-a3$. Addresses of the third bank B3 are available from a LSB area or a MSB area by $2^{K3}-a3$.

A fourth bank B4 has bad pages corresponding to a4. The fourth bank B4 has a substantial density less than a full density by a4. When the full density of the fourth bank B4 is $2^{K4}$, the substantial density of the fourth bank B4 may be $2^{K4}-a4$. Addresses of the fourth bank B4 are available from a LSB area or a MSB area by $2^{K4}-a4$.

As shown in FIG. 2, the number of the bad pages a1 of the first bank B1, the number of the bad pages a2 of the second bank B2, the number of the bad pages a3 of the third bank B3 and the number of the bad pages a4 of the fourth bank B4 may be different from one another.

Figure 3:
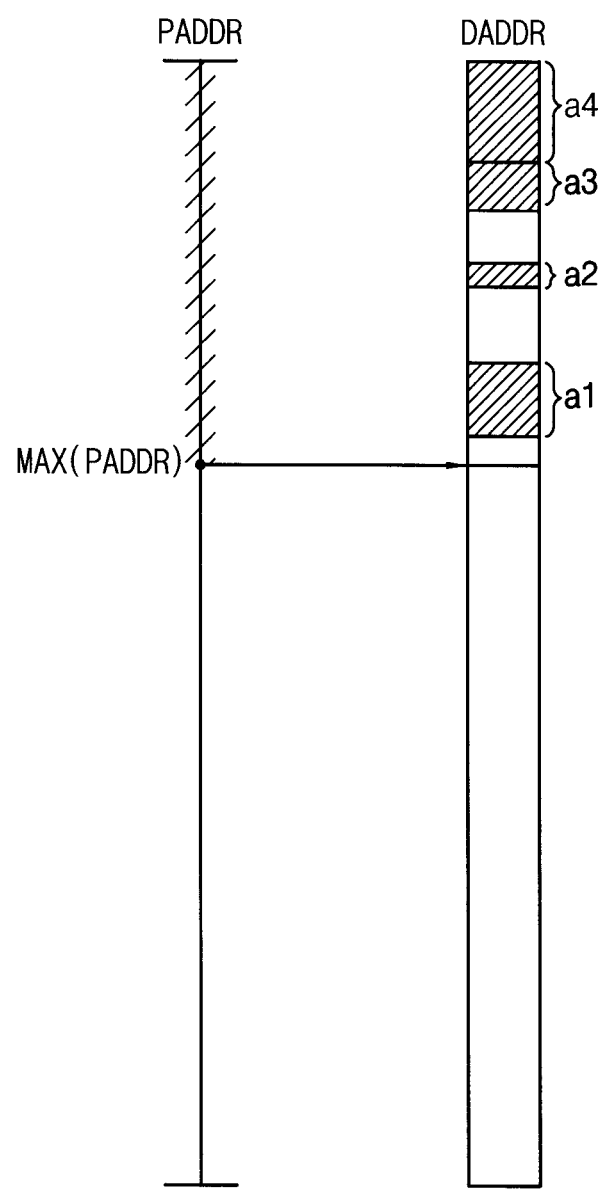
FIG. 3 is a conceptual diagram illustrating a method of mapping an address by a memory controller of FIG. 1, according to an example embodiment.

FIG. 3 is a conceptual diagram illustrating a method of mapping an address by the memory controller 200 of FIG. 1.

Referring to FIGS. 1 to 3, the memory controller 200 maps the continuous physical address PADDR to the dram address DADDR of the memory module 100 based on the density information received from the memory module 100.

When the addresses of the first to fourth banks B1 to B4 are simply connected, dram addresses of a replacement area of the first bank B1 are disposed between dram addresses of a normal page area of the first bank B1 and dram addresses of a normal page area of the second bank B2, dram addresses of a replacement area of the second bank B2 are disposed between the dram addresses of the normal page area of the second bank B2 and dram addresses of a normal page area of the third bank B3 and dram addresses of a replacement area of the third bank B3 are disposed between the dram addresses of the normal page area of the third bank B3 and dram addresses of a normal page area of the fourth bank B4.

The dram addresses disposed between the normal page areas forms an address hole. When the dram addresses of the first to fourth banks B1 to B4 are simply connected, continuous address management is impossible due to the address hole.

In the present example embodiment, the density information may be generated based on the maximum number of the bad pages (e.g. a4 in FIG. 2) among the first to fourth banks B1 to B4.

The memory module 100 provides the maximum number of the bad pages a4 of the fourth bank B4 among the first to fourth banks B1 to B4 to the memory controller 200.

The memory controller 200 determines an address unallocated area of the memory module 100 based on the number of the bad page a4 of the fourth bank B4 for the first to fourth banks B1 to B4.

Thus, the memory controller 200 continuously allocates the dram address DADDR of the first to fourth banks B1 to B4.

When a full address corresponding to the full density of the memory module 100 is X, the maximum of the physical address PADDR may be X−4*a4.

When the full address of the memory module 100 is X, and the number of the banks is N, and the maximum number of the bad pages of the bank is max(a), the maximum of the physical address PADDR may be X−N*max(a).

The memory controller 200 may output the maximum physical address MAX(PADDR) to the operating system 300.

For example, the above-mentioned method of mapping the address may be proper to a mapping sequence of the row address, the bank address and the column address (RA-BA-CA).

In the present example embodiment, the memory controller 200 may include a page translation layer (PTL) to map the continuous physical address PADDR to the dram address DADDR of the memory module 100.

The bad page of the memory module 100 is replaced with the normal page and the continuous address area is guaranteed in a manufacturing step. The bad page occurred after the manufacturing step may be remapped using the page translating layer.

The page translating layer detects and stores the bad page information, and remaps the bad page with a replace page to guarantee the continuous dram address.

According to the present example embodiment, although the discontinuous dram address area exists between the banks of the memory module 100, the continuous physical address PADDR of the memory controller 200 may be guaranteed.

Figure 4:
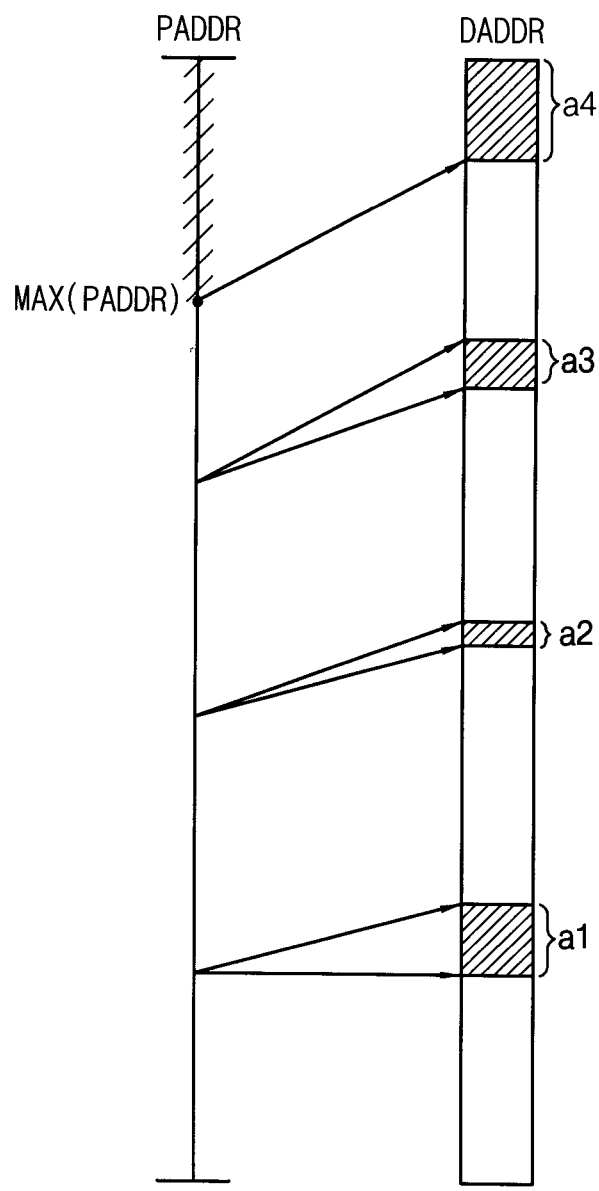
FIG. 4 is a conceptual diagram illustrating a method of mapping an address by a memory controller, according to an example embodiment of the present inventive concepts.

FIG. 4 is a conceptual diagram illustrating a method of mapping an address by a memory controller 200 according to an example embodiment of the present inventive concept.

In the present example embodiment, the memory module 100 has the bad pages per banks same as the memory module 100 of FIG. 2.

Referring to FIGS. 1, 2 and 4, the memory controller 200 maps the continuous physical address PADDR to the dram address DADDR of the memory module 100 based on the density information received from the memory module 100.

In the present example embodiment, the memory module 100 provides the numbers of the bad pages a1 to a4 of the first to fourth banks B1 to B4 to the memory controller 200.

The memory controller 200 determines an address unallocated area of the memory module 100 based on the numbers of the bad pages a1 to a4 of the first to fourth banks B1 to B4 for the first to fourth banks B1 to B4.

The memory controller 200 may continuously map the dram address DADDR of the first to fourth banks B1 to B4 using offset addresses corresponding to the numbers of the bad pages a1 to a4 of the first to fourth banks B1 to B4.

For example, the dram address DADDR of a normal page area of the first bank B1 is mapped to the physical address PADDR in a parallel manner.

A physical address PADDR after an end portion of the normal page area of the first bank B1 indicates not a start portion of a replacement area of the first bank B1 but a start portion of a normal page area of the second bank B2.

The physical address PADDR is mapped to the dram address DADDR to skip the dram address DADDR of the replacement area of the first bank B1.

For example, the physical address PADDR after the end portion of the normal page area of the first bank B1 may be mapped to the dram address DADDR by adding a page offset value corresponding to the number of the bad pages to the start portion of the replacement area of the first bank B1.

In the same manner, the physical address PADDR does not have discontinuous area so that the continuous physical address PADDR is guaranteed.

In the present example embodiment, when a full address corresponding to the full density of the memory module 100 is X, the maximum of the physical address PADDR may be X−(a1+a2+a3+a4).

When the full address of the memory module 100 is X, and the number of the banks is N, and the numbers of the bad pages of the banks are a1 to aN, the maximum of the physical address PADDR may be $$X - \sum_{i=1}^{N} ai.$$

The memory controller 200 may output the maximum physical address MAX(PADDR) to the operating system 300.

For example, the above-mentioned method of mapping the address may be proper to a mapping sequence of the bank address, the row address and the column address (BA-RA-CA).

According to the present example embodiment, although the discontinuous dram address area exists between the banks of the memory module 100, the continuous physical address PADDR of the memory controller 200 may be guaranteed.

Figure 5:
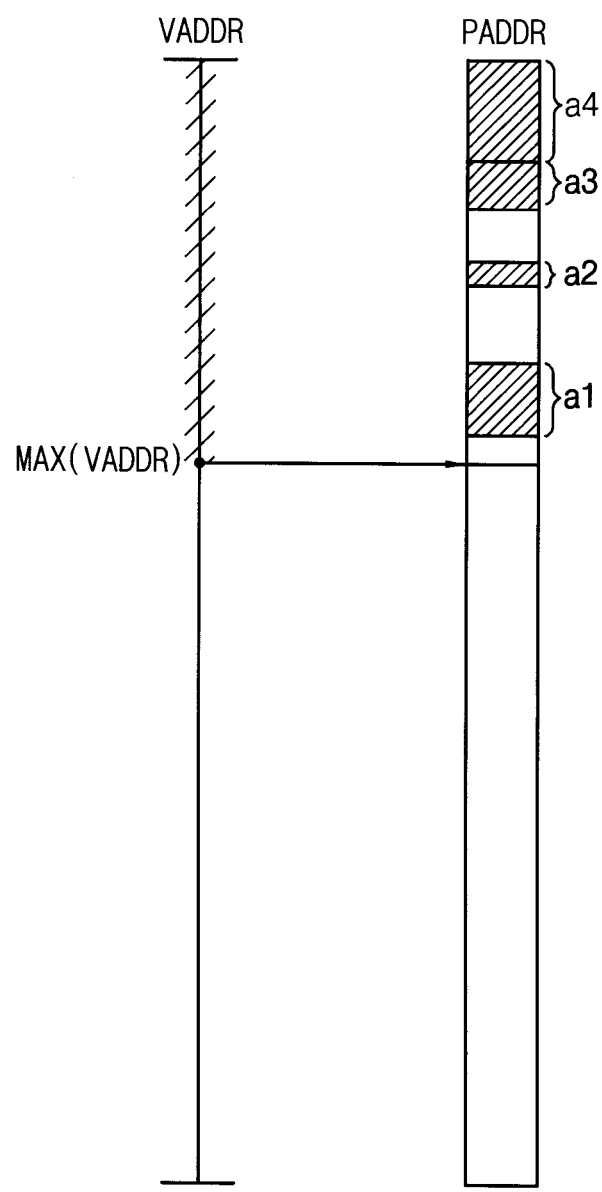
FIG. 5 is a conceptual diagram illustrating a method of mapping an address by an operating system, according to an example embodiment of the present inventive concepts.

FIG. 5 is a conceptual diagram illustrating a method of mapping an address by an operating system 300 according to an example embodiment of the present inventive concept.

The method of mapping an address according to the present example embodiment is substantially the same as the method of mapping an address of the previous example embodiment explained referring to FIGS. 1 to 3 except that the operating system 300 guarantees the continuous address mapping. Thus, the same reference numerals will be used to refer to the same or like parts as those described in the previous example embodiment of FIGS. 1 to 3 and any repetitive explanation concerning the above elements will be omitted.

In the present example embodiment, the memory module 100 has the bad pages per banks same as the memory module 100 of FIG. 2.

Referring to FIGS. 1, 2 and 5, the operating system 300 receives the density information of the memory module 100 from the memory controller 200. The operating system 300 maps a continuous virtual address VADDR to the physical address PADDR of the memory controller 200 based on the density information received from the memory module 100.

In the present example embodiment, the density information may be generated based on the maximum number of the bad pages (e.g. a4 in FIG. 2) among the first to fourth banks B1 to B4.

The memory module 100 provides the maximum number of the bad pages a4 of the fourth bank B4 among the first to fourth banks B1 to B4 to the memory controller 200.

The memory controller 200 transmits the density information of the memory module 100 to the operating system 300.

The operating system 300 determines an address unallocated area of the memory module 100 based on the number of the bad page a4 of the fourth bank B4 for the first to fourth banks B1 to B4.

Thus, the operating system 300 continuously allocates the physical address PADDR corresponding to the first to fourth banks B1 to B4. Thus, the dram address of the first to fourth banks B1 to B4 may be continuously allocated.

According to the present example embodiment, although the discontinuous dram address area exists between the banks of the memory module 100, the continuous virtual address VADDR of the operating system 300 may be guaranteed.

Figure 6:
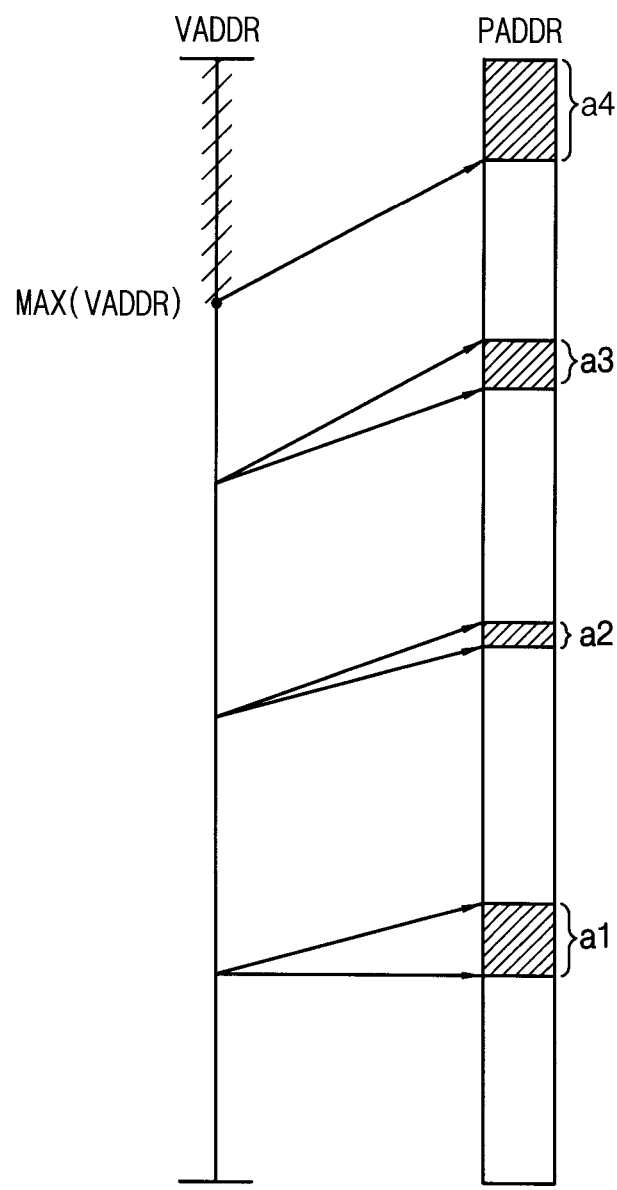
FIG. 6 is a conceptual diagram illustrating a method of mapping an address by an operating system, according to an example embodiment of the present inventive concepts.

FIG. 6 is a conceptual diagram illustrating a method of mapping an address by an operating system 300 according to an example embodiment of the present inventive concept.

The method of mapping an address according to the present example embodiment is substantially the same as the method of mapping an address of the previous example embodiment explained referring to FIGS. 1, 2 and 4 except that the operating system 300 guarantees the continuous address mapping. Thus, the same reference numerals will be used to refer to the same or like parts as those described in the previous example embodiment of FIGS. 1, 2 and 4 and any repetitive explanation concerning the above elements will be omitted.

In the present example embodiment, the memory module 100 has the bad pages per banks same as the memory module 100 of FIG. 2.

Referring to FIGS. 1, 2 and 6, the operating system 300 receives the density information of the memory module 100 from the memory controller 200. The operating system 300 maps a continuous virtual address VADDR to the physical address PADDR of the memory controller 200 based on the density information received from the memory module 100.

In the present example embodiment, the memory module 100 provides the numbers of the bad pages a1 to a4 of the first to fourth banks B1 to B4 to the memory controller 200.

The memory controller 200 transmits the density information of the memory module 100 to the operating system 300.

The operating system 300 determines an address unallocated area of the memory module 100 based on the numbers of the bad pages a1 to a4 of the first to fourth banks B1 to B4 for the first to fourth banks B1 to B4.

The operating system 300 may continuously allocate the physical address PADDR corresponding to the first to fourth banks B1 to B4 using offset addresses corresponding to the numbers of the bad pages a1 to a4 of the first to fourth banks B1 to B4. Thus, the dram address of the first to fourth banks B1 to B4 may be continuously allocated.

According to the present example embodiment, although the discontinuous dram address area exists between the banks of the memory module 100, the continuous virtual address VADDR of the operating system 300 may be guaranteed.

Figure 7:
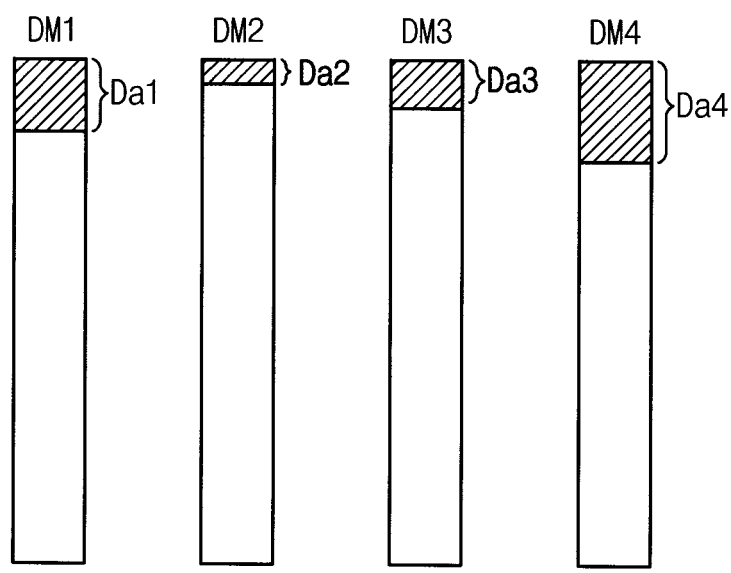
FIG. 7 is a conceptual diagram illustrating bad pages per memory devices of a memory module, according to an example embodiment of the present inventive concepts.

FIG. 7 is a conceptual diagram illustrating bad pages per memory devices of a memory module 100 according to an example embodiment of the present inventive concept.

The memory module of the present example embodiment includes a plurality of memory devices. Although the memory module includes four memory devices in FIG. 7, the present inventive concepts is not limited thereto.

The method of mapping the address concerning the plurality of banks respectively having bad pages explained referring to FIGS. 1 to 3 may be applied to the method of mapping the address concerning the plurality of memory devices respectively having bad pages.

Referring to FIGS. 1 and 7, a first memory device DM1 has bad pages corresponding to Da1. Herein, a normal page area of the first memory device DM1 has continuous addresses. The first memory device DM1 has a substantial density less than a full density by Da1. When the full density of the first memory device DM1 is $2^{L1}$, the substantial density of the first memory device DM1 may be $2^{L1}$–Da1. Addresses of the first memory device DM1 are available from a LSB area or a MSB area by $2^{L1}$–Da1.

A second memory device DM2 has bad pages corresponding to Da2. The second memory device DM2 has a substantial density less than a full density by Da2. When the full density of the second memory device DM2 is $2^{L2}$, the substantial density of the second memory device DM2 may be $2^{L2}$–Da2. Addresses of the second memory device DM2 are available from a LSB area or a MSB area by $2^{L2}$–Da2.

A third memory device DM3 has bad pages corresponding to Da3. The third memory device DM3 has a substantial density less than a full density by Da3. When the full density of the third memory device DM3 is $2^{L3}$, the substantial density of the third memory device DM3 may be $2^{L3}$–Da3. Addresses of the third memory device DM3 are available from a LSB area or a MSB area by $2^{L3}$–Da3.

A fourth memory device DM4 has bad pages corresponding to Da4. The fourth memory device DM4 has a substantial density less than a full density by Da4. When the full density of the fourth memory device DM4 is $2^{L4}$, the substantial density of the fourth memory device DM4 may be $2^{L4}$–Da4. Addresses of the fourth memory device DM4 are available from a LSB area or a MSB area by $2^{L4}$–Da4.

As shown in FIG. 7, the number of the bad pages Da1 of the first memory device DM1, the number of the bad pages Da2 of the second memory device DM2, the number of the bad pages Da3 of the third memory device DM3 and the number of the bad pages Da4 of the fourth memory device DM4 may be different from one another.

Figure 8:
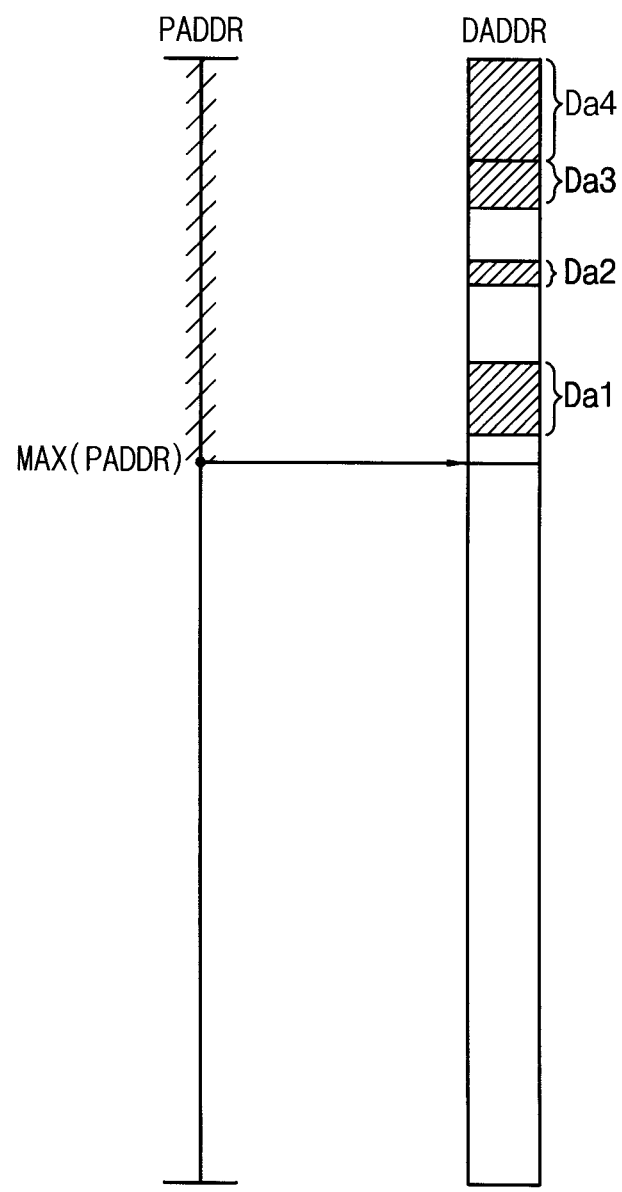
FIG. 8 is a conceptual diagram illustrating a method of mapping an address by a memory controller of a memory system of FIG. 7, according to an example embodiment.

FIG. 8 is a conceptual diagram illustrating a method of mapping an address by a memory controller 200 of a memory system of FIG. 7.

Referring to FIGS. 1, 7 and 8, the memory controller 200 maps the continuous physical address PADDR to the dram address DADDR of the memory module 100 based on the density information received from the memory module 100.

When the addresses of the first to fourth memory devices DM1 to DM4 are simply connected, replacement areas of the memory device are disposed between normal page areas of the memory device. The dram address of the replacement area forms an address hole. When the dram addresses of the first to fourth memory devices DM1 to DM4 are simply connected, continuous address management is impossible due to the address hole.

In the present example embodiment, the density information may be generated based on the maximum number of the bad pages (e.g. Da4 in FIG. 7) among the first to fourth memory devices DM1 to DM4.

The memory module 100 provides the maximum number of the bad pages Da4 of the fourth memory device DM4 among the first to fourth memory devices DM1 to DM4 to the memory controller 200.

The memory controller 200 determines an address unallocated area of the memory module 100 based on the number of the bad page a4 of the fourth memory device DM4 for the first to fourth memory devices DM1 to DM4.

Thus, the memory controller 200 continuously allocates the dram address of the first to fourth memory devices DM1 to DM4.

When a full address corresponding to the full density of the memory module 100 is X, the maximum of the physical address PADDR may be X−4*Da4.

When the full address of the memory module 100 is X, and the number of the memory devices is N, and the maximum number of the bad pages of the memory device is max(Da), the maximum of the physical address PADDR may be X−N*max(Da).

The memory controller 200 may output the maximum physical address MAX(PADDR) to the operating system 300.

For example, the above-mentioned method of mapping the address may be proper to a mapping sequence of a chip select signal, the row address, the bank address and the column address (Cs-RA-BA-CA).

According to the present example embodiment, although the discontinuous dram address area exists between the memory devices of the memory module 100, the continuous physical address PADDR of the memory controller 200 may be guaranteed.

Figure 9:
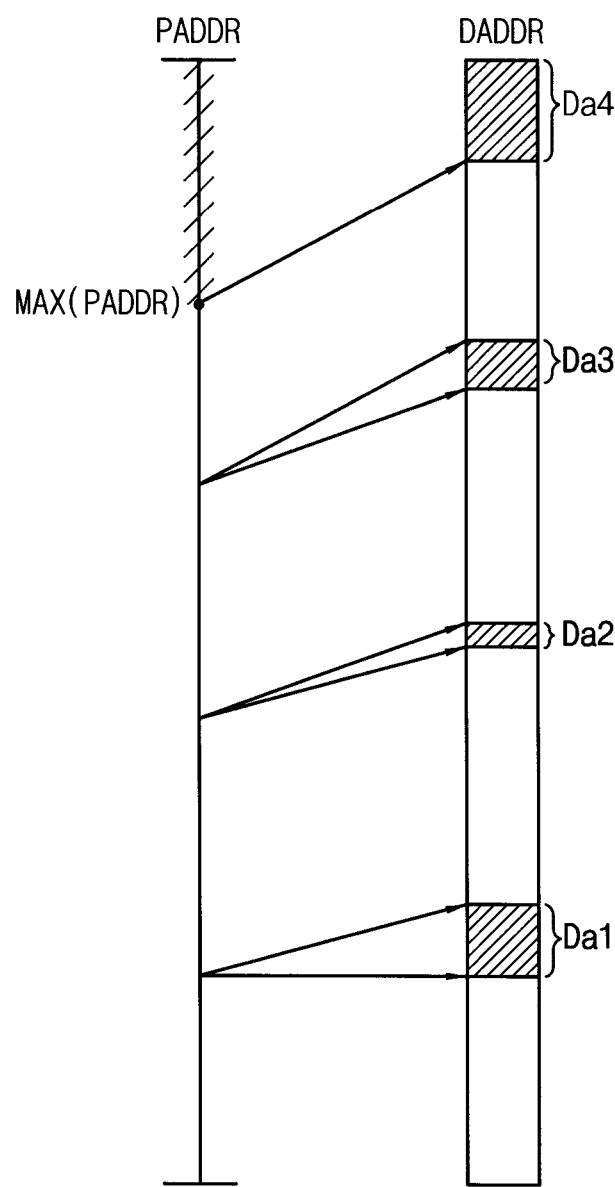
FIG. 9 is a conceptual diagram illustrating a method of mapping an address by a memory controller, according to an example embodiment of the present inventive concepts.

FIG. 9 is a conceptual diagram illustrating a method of mapping an address by a memory controller 200 according to an example embodiment of the present inventive concept.

In the present example embodiment, the memory module 100 has the bad pages per memory device same as the memory module 100 of FIG. 7.

Referring to FIGS. 1, 7 and 9, the memory controller 200 maps the continuous physical address PADDR to the dram address DADDR of the memory module 100 based on the density information received from the memory module 100.

In the present example embodiment, the memory module 100 provides the numbers of the bad pages Da1 to Da4 of the first to fourth memory devices DM1 to DM4 to the memory controller 200.

The memory controller 200 determines an address unallocated area of the memory module 100 based on the numbers of the bad pages Da1 to Da4 of the first to fourth memory devices DM1 to DM4 for the first to fourth memory devices DM1 to DM4.

The memory controller 200 may continuously map the dram address DADDR of the first to fourth memory devices DM1 to DM4 using offset addresses corresponding to the numbers of the bad pages Da1 to Da4 of the first to fourth memory devices DM1 to DM4.

For example, the dram address DADDR of a normal page area of the first memory device DM1 is mapped to the physical address PADDR in a parallel manner.

A physical address PADDR after an end portion of the normal page area of the first memory device DM1 indicates not a start portion of a replacement area of the first memory device DM1 but a start portion of a normal page area of the second memory device DM2.

The physical address PADDR is mapped to the dram address DADDR to skip the dram address DADDR of the replacement area of the first memory device DM1.

For example, the physical address PADDR after the end portion of the normal page area of the first memory device DM1 may be mapped to the dram address DADDR by adding a page offset value corresponding to the number of the bad pages to the start portion of the replacement area of the first memory device DM1.

In the same manner, the physical address PADDR does not have discontinuous area so that the continuous physical address PADDR is guaranteed.

In the present example embodiment, when a full address corresponding to the full density of the memory module 100 is X, the maximum of the physical address PADDR may be X−(Da1+Da2+Da3+Da4).

When the full address of the memory module 100 is X, and the number of the memory devices is N, and the numbers of the bad pages of the memory devices are Da1 to DaM, the maximum of the physical address PADDR may be $$X - \sum_{i=1}^{M} Dai.$$

The memory controller 200 may output the maximum physical address MAX(PADDR) to the operating system 300.

For example, the above-mentioned method of mapping the address may be proper to a mapping sequence of the memory device address, a chip select signal, the row address and the column address (Cs-BA-RA-CA).

According to the present example embodiment, although the discontinuous dram address area exists between the memory devices of the memory module 100, the continuous physical address PADDR of the memory controller 200 may be guaranteed.

Figure 10:
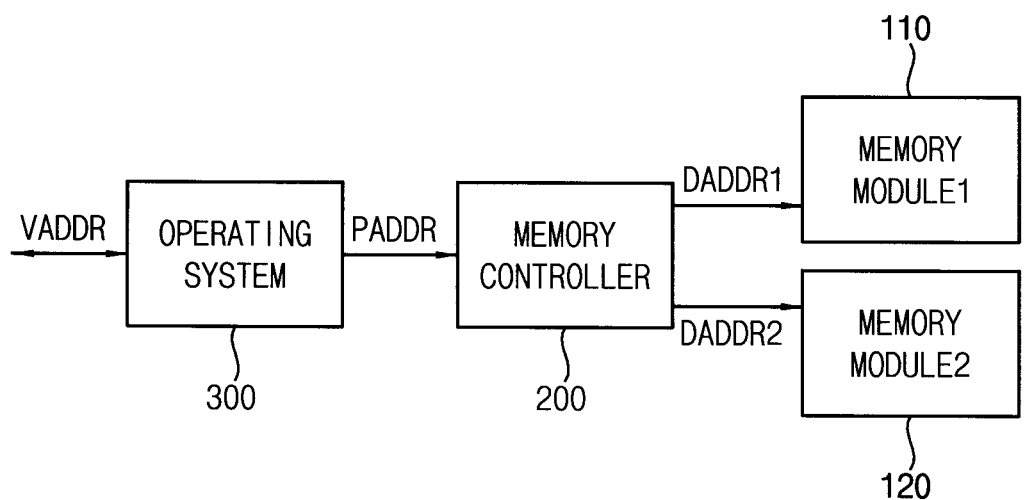
FIG. 10 is a block diagram illustrating a memory system and an operating system, according to an example embodiment of the present inventive concepts.
Figure 11:
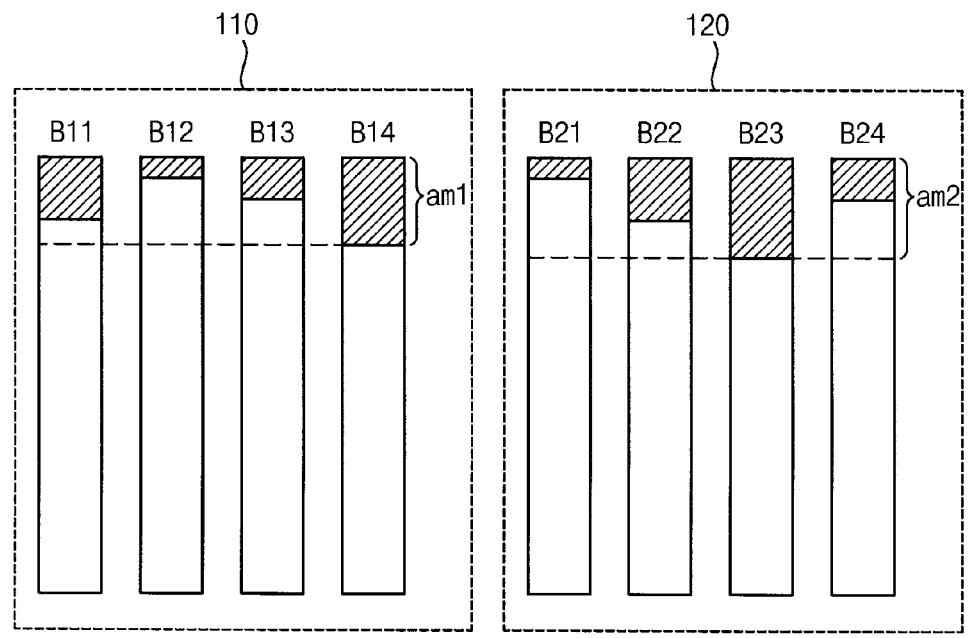
FIG. 11 is a conceptual diagram illustrating banks of first and second memory modules of FIG. 10, according to an example embodiment.

FIG. 10 is a block diagram illustrating a memory system and an operating system according to an example embodiment of the present inventive concepts. FIG. 11 is a conceptual diagram illustrating banks of first and second memory modules of FIG. 10.

The memory system according to the present example embodiment is substantially the same as the memory system of the previous example embodiment explained referring to FIGS. 1 to 3 except that the memory system includes a plurality of memory modules. Thus, the same reference numerals will be used to refer to the same or like parts as those described in the previous example embodiment of FIGS. 1 to 3 and any repetitive explanation concerning the above elements will be omitted.

Referring to FIGS. 10 and 11, the memory system includes a first memory module 110, a second memory module 120 and a memory controller 200. The memory system is connected to an operating system 300.

In the present example embodiment, the first memory module 110 may include a first memory device. The first memory device may include a plurality of banks. Although the first memory device includes four banks in FIG. 11, the present inventive concepts is not limited thereto.

In the present example embodiment, the second memory module 120 may include a second memory device. The second memory device may include a plurality of banks. Although the second memory device includes four banks in FIG. 11, the present inventive concepts is not limited thereto.

The first memory module 110 includes first to fourth banks B11, B12, B13 and B14. The second memory module 120 includes first to fourth banks B21, B22, B23 and B24.

The first memory module 110 has a first dram address DADDR1. The second memory module 120 has a second dram address DADDR2.

The memory controller 200 maps the continuous physical address PADDR to the first dram address DADDR1 of the first memory module 110 based on first density information received from the first memory module 110.

The memory controller 200 maps the continuous physical address PADDR to the second dram address DADDR2 of the second memory module 120 based on second density information received from the second memory module 120.

The first dram address DADDR1 and the second dram address DADDR2 may be independently managed.

As explained referring to FIG. 3, the memory controller 200 determines an address unallocated area of the first memory module 110 based on the maximum number of the bad pages am1 of the banks for the first to fourth banks B11 to B14 of the first memory module 110.

Thus, the memory controller 200 continuously allocates the first dram address DADDR1 of the first to fourth banks B11 to B14 of the first memory module 110.

As explained referring to FIG. 3, the memory controller 200 determines an address unallocated area of the second memory module 120 based on the maximum number of the bad pages am2 of the banks for the first to fourth banks B11 to B14 of the second memory module 120.

Thus, the memory controller 200 continuously allocates the second dram address DADDR2 of the first to fourth banks B21 to B24 of the second memory module 120.

Alternatively, as explained referring to FIG. 4, the memory controller 200 continuously allocates the first dram address DADDR1 using the respective numbers of the bad pages of the first to fourth banks B11 to B14 of the first memory module 110.

In addition, the memory controller 200 continuously allocates the second dram address DADDR2 using the respective numbers of the bad pages of the first to fourth banks B21 to B24 of the second memory module 120.

Alternatively, as explained referring to FIG. 5, the operating system 300 continuously allocates the first dram address DADDR1 using the maximum number of the bad pages am1 of the first to fourth banks B11 to B14 of the first memory module 110.

In addition, the operating system 300 continuously allocates the second dram address DADDR2 using the maximum number of the bad pages am2 of the first to fourth banks B21 to B24 of the second memory module 120.

Alternatively, as explained referring to FIG. 6, the operating system 300 continuously allocates the first dram address DADDR1 using the respective numbers of the bad pages of the first to fourth banks B11 to B14 of the first memory module 110.

In addition, the operating system 300 continuously allocates the second dram address DADDR2 using the respective numbers of the bad pages of the first to fourth banks B21 to B24 of the second memory module 120.

The method of mapping the address concerning the memory module including a plurality of memory devices explained referring to FIGS. 7 to 9 may be applied to the first memory module 110 and the second module 120 of the present example embodiment.

According to the present example embodiment, although the discontinuous dram address area exists between the banks of the first memory module 110, the continuous physical address PADDR of the memory controller 200 corresponding to the first memory module 110 may be guaranteed. Although the discontinuous dram address area exists between the banks of the second memory module 120, the continuous physical address PADDR of the memory controller 200 corresponding to the second memory module 120 may be guaranteed.

Figure 12:
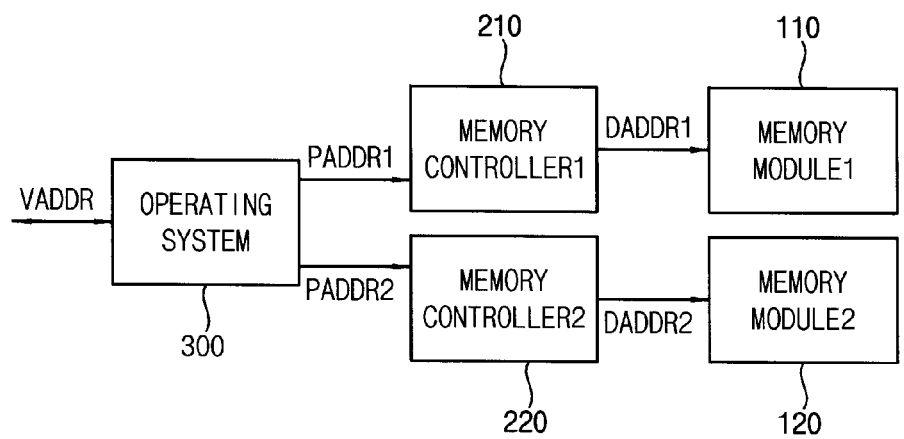
FIG. 12 is a block diagram illustrating a memory system and an operating system, according to an example embodiment of the present inventive concepts.

FIG. 12 is a block diagram illustrating a memory system and an operating system according to an example embodiment of the present inventive concept.

The memory system according to the present example embodiment is substantially the same as the memory system of the previous example embodiment explained referring to FIGS. 1 to 3 except that the memory system includes a plurality of memory controllers and a plurality of memory modules. Thus, the same reference numerals will be used to refer to the same or like parts as those described in the previous example embodiment of FIGS. 1 to 3 and any repetitive explanation concerning the above elements will be omitted.

Referring to FIG. 12, the memory system includes a first memory module 110, a second memory module 120, a first memory controller 120 and a second memory controller 220. The memory system is connected to an operating system 300.

The first memory controller 210 controls an operation of the first memory module 110. The second memory controller 220 controls an operation of the second memory module 120.

The first memory module 110 has a first dram address DADDR1. The second memory module 120 has a second dram address DADDR2.

The first memory controller 210 maps a continuous first physical address PADDR1 to the first dram address DADDR1 of the first memory module 110 based on first density information received from the first memory module 110.

The second memory controller 220 maps a continuous second physical address PADDR2 to the second dram address DADDR2 of the second memory module 120 based on second density information received from the second memory module 120.

The first dram address DADDR1 and the second dram address DADDR2 may be independently managed.

The methods of mapping the address explained referring to FIGS. 3 to 9 may be applied among the first module 110, the first controller 210 and the operating system 300.

The methods of mapping the address explained referring to FIGS. 3 to 9 may be applied among the second module 120, the second controller 220 and the operating system 300.

According to the present example embodiment, although the discontinuous dram address area exists between the banks of the first memory module 110, the continuous first physical address PADDR1 of the first memory controller 210 may be guaranteed. Although the discontinuous dram address area exists between the banks of the second memory module 120, the continuous second physical address PADDR2 of the second memory controller 220 may be guaranteed.

Figure 13:
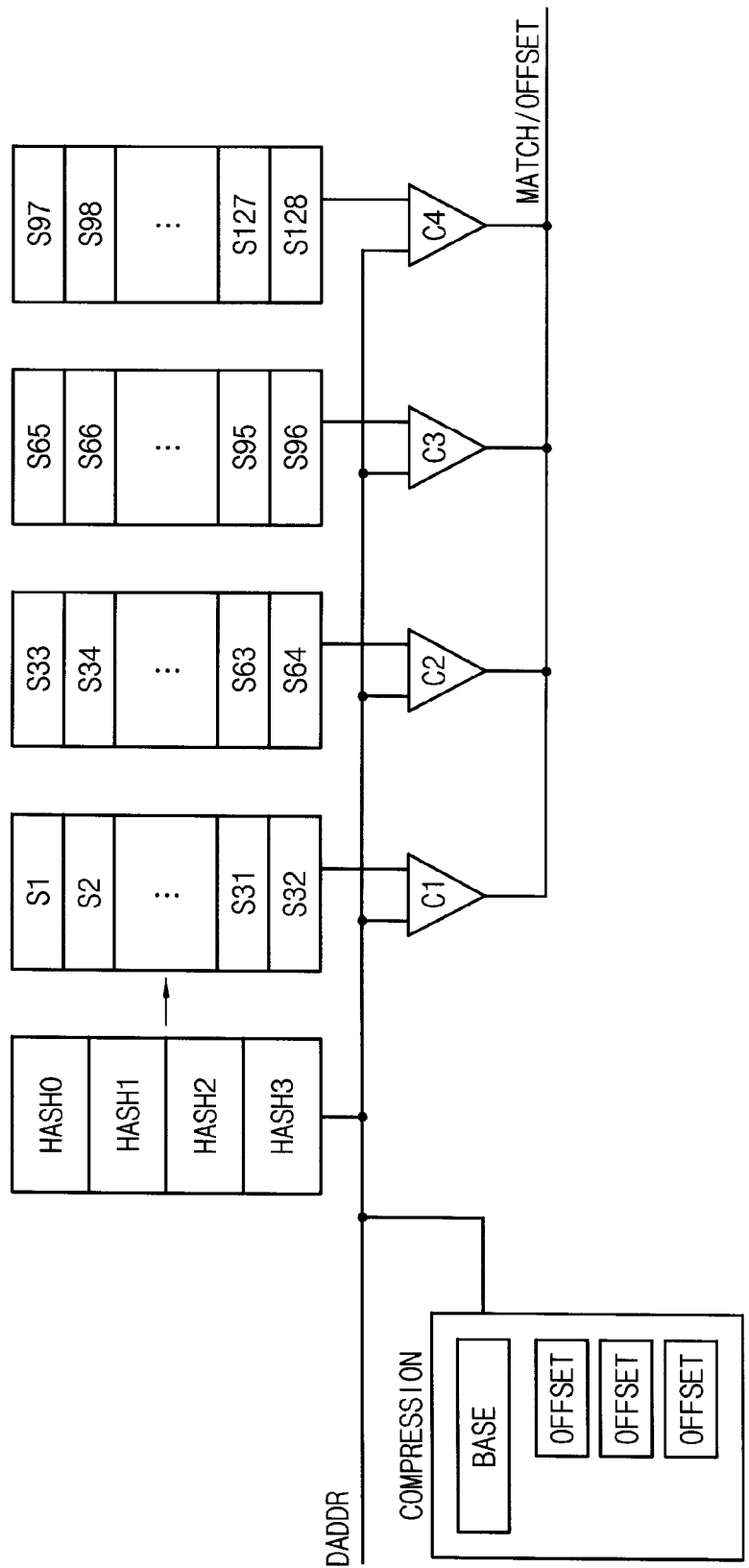
FIG. 13 is a conceptual diagram illustrating a method of replacing a bad page with a normal page, according to an example embodiment of the present inventive concepts.

FIG. 13 is a conceptual diagram illustrating a method of replacing a bad page with a normal page according to an example embodiment of the present inventive concept.

The memory system according to the present example embodiment is substantially the same as the memory system of the previous example embodiment explained referring to FIGS. 1 to 3 except for a method of replacing a bad page with a normal page. Thus, the same reference numerals will be used to refer to the same or like parts as those described in the previous example embodiment of FIGS. 1 to 3 and any repetitive explanation concerning the above elements will be omitted.

Referring to FIGS. 1 and 13, the memory system includes a memory module 100 and a memory controller 200. The memory system includes an operating system 300.

The memory module 100 replaces a bad page having a fault with a normal page. The memory module 100 does not include a redundancy cell for the bad page having a fault. When the bad page is generated, a normal page in a full density is used as a replacement page. Thus, as the number of the bad pages increases, a substantial density of the memory module 100 decreases.

In the present example embodiment, the memory module 100 includes a page table S1 to S128 storing an address of the bad page having an error.

When the dram address DADDR is inputted to the memory module 100, the dram address DADDR is compared to a fault address in the page table. When the dram address DADDR is same as the fault address in the page table, a replacing address is designated and the bad page is replaced with the normal page corresponding to the replacing address.

The page table storing the fault address may use a hashing function. The fault address may be grouped using the hashing function.

A method of determining the groups using the hashing function is represented as a hashing logic HASH0 to HASH3. For example, the hashing logic may include a plurality of exclusive OR gates. The exclusive OR gates operate an exclusive OR operation for a part of bits among total bits of a row address to generate bits of the group address.

The fault address is grouped using the hashing function, the number of comparators C1 to C4 and a lookup time may be decreased.

The page table may be compressed using a base address and an offset address.

For example, the page table S1 to S128 storing the fault address may store 128 fields per the banks. For example, the page table may have four columns. Each column may include thirty two fields.

The fault address in the page table is compressed using the base address and the offset address so that a size of the page table may be decreased.

Figure 14:
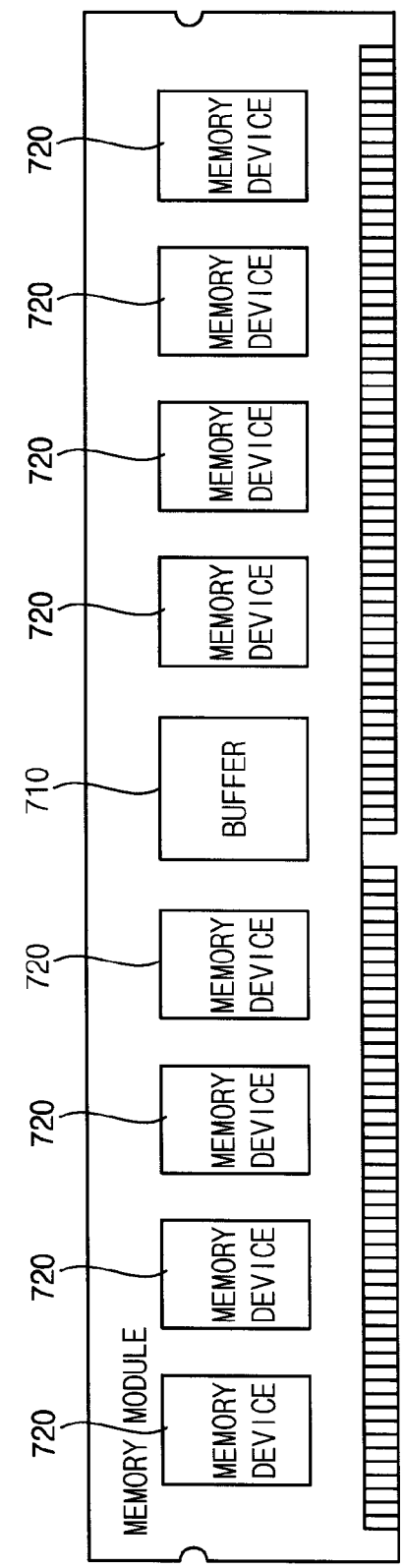
FIG. 14 is a block diagram illustrating a memory module including memory devices, according to an example embodiment of the present inventive concepts.

FIG. 14 is a block diagram illustrating a memory module 700 including memory devices 720 according to the example embodiments of the present inventive concept.

Referring to FIG. 14, a memory module 700 may include a plurality of memory devices 720. In some embodiments, the memory module 700 may be an unbuffered dual in-line memory module (UDIMM), a registered dual in-line memory module (RDIMM), a fully buffered dual in-line memory module (FBDIMM), a load reduced dual in-line memory module LRDIMM, etc.

The memory module 700 may further include a buffer 710 which provides a command/address signal and data by buffering the command/address signal and the data from a memory controller through a plurality of transmission lines to the memory devices 720.

In some embodiments, data transmission lines between the buffer 710 and the memory devices 720 may be coupled in a point-to-point topology, and command/address transmission lines between the buffer 710 and the memory devices 300 may be coupled in a multi-drop topology, a daisy-chain topology, a fly-by daisy-chain topology, or the like. Since the buffer 710 buffers both the command/address signal and the data, the memory controller may interface with the memory module 700 by driving only a load of the buffer 710. Accordingly, the memory module 700 may include more memory devices 720 and/or more memory ranks, and a memory system may include more memory modules.

The memory device 720 replaces the bad page having a fault with the normal page, generates the density information based on the number of the bad page, and outputs the density information to the memory controller. Thus, although the memory device 720 has the discontinuous dram address area, the continuous physical address or the continuous virtual address may be guaranteed by the memory controller and the operating system. In an example embodiment, the memory device 100 in FIGS. 1 and 2 may be employed to the memory device 720. The memory device 100 in FIGS. 1 and 2 are explained referring to FIGS. 1 to 3 in detail so that any repetitive explanation concerning the memory device 720 will be omitted.

Figure 15:
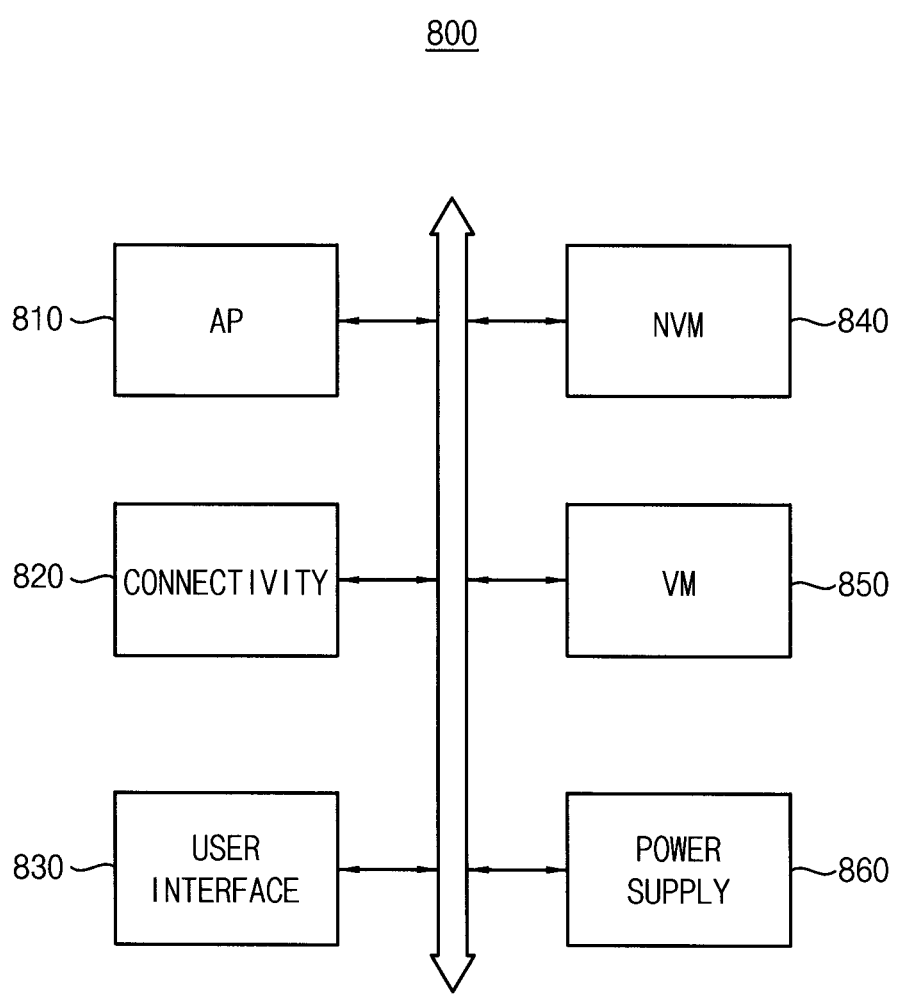
FIG. 15 is a conceptual diagram illustrating a memory system, according to an example embodiment of the present inventive concepts applied to a mobile system.

FIG. 15 is a conceptual diagram illustrating a memory system according to the example embodiments of the present inventive concepts applied to a mobile system 800.

Referring to FIG. 15, a mobile system 800 includes an application processor 810, a connectivity unit 820, a user interface 830, a nonvolatile memory device 840, a volatile memory device 850, and a power supply 860. In some embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity unit 820 may perform wired or wireless communication with an external device. For example, the connectivity unit 820 may perform Ethernet communication, near field communication (NFC), radio frequency identification (RFID) communication, mobile telecommunication, memory card communication, universal serial bus (USB) communication, etc. In some embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 replaces the bad page having a fault with the normal page, generates the density information based on the number of the bad page, and outputs the density information to the memory controller. Thus, although the volatile memory device 850 has the discontinuous dram address area, the continuous physical address or the continuous virtual address may be guaranteed by the memory controller and the operating system. In an example embodiment, the memory device 100 in FIGS. 1 and 2 may be employed to the volatile memory device 850. The memory device 100 in FIGS. 1 and 2 are explained referring to FIGS. 1 to 3 in detail so that any repetitive explanation concerning the volatile memory device 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some embodiments, the mobile system 800 may further include a camera image processor (CIS), and/or a storage device, such as a memory card, a solid state drive (SSD), a hard disk drive (HDD), a CD-ROM, etc.

In some embodiments, the mobile system 800 and/or components of the mobile system 800 may be packaged in various forms, such as package on package (PoP), ball grid arrays (BGAs), chip scale packages (CSPs), plastic leaded chip carrier (PLCO), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), or wafer-level processed stack package (WSP).

Figure 16:
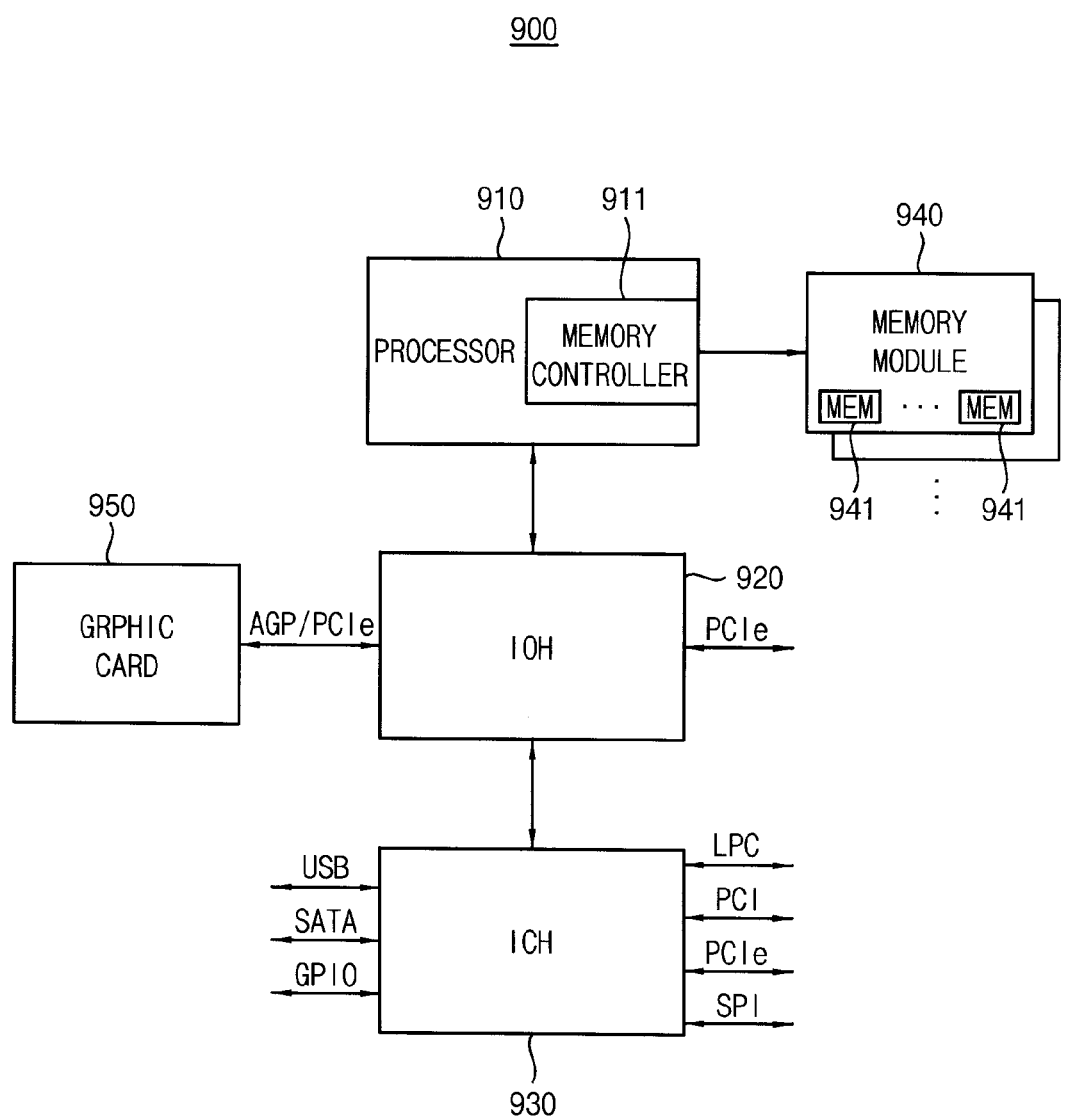
FIG. 16 is a conceptual diagram illustrating a memory system, according to an example embodiment of the inventive concepts applied to a computing system.

FIG. 16 is a conceptual diagram illustrating a memory system according to the example embodiments of the present inventive concepts applied to a computing system 900.

Referring to FIG. 16, a computing system 900 includes a processor 910, an input/output hub (IOH) 920, an input/output controller hub (ICH) 930, at least one memory module 940 and a graphics card 950. In some embodiments, the computing system 900 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, etc. Although FIG. 9 illustrates the computing system 900 including one processor 910, in some embodiments, the computing system 900 may include a plurality of processors. The processor 910 may include an internal or external cache memory.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920, which may be referred to as memory controller hub (MCH).

The memory module 940 may include a plurality of memory devices (MEM) 941 that store data provided from the memory controller 911. The memory device 941 replaces the bad page having a fault with the normal page, generates the density information based on the number of the bad page, and outputs the density information to the memory controller. Thus, although the memory device 941 has the discontinuous dram address area, the continuous physical address or the continuous virtual address may be guaranteed by the memory controller and the operating system. In an example embodiment, the memory device 100 in FIGS. 1 and 2 may be employed to the memory device 941. The memory device 100 in FIGS. 1 and 2 are explained referring to FIGS. 1 to 3 in detail so that any repetitive explanation concerning the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. Although FIG. 40 illustrates the computing system 900 including one input/output hub 920, in some embodiments, the computing system 900 may include a plurality of input/output hubs. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc.

The graphics card 950 may be coupled to the input/output hub 920 via AGP or PCIe. The graphics card 950 may control a display device (not shown) for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DM1), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The present inventive concepts may be applied to an electronic device including a memory device. For example, the present inventive concepts may be applied to a mobile phone, a smart phone, a personal digital assistant (PDA), a portable multimedia player (PMP), a digital camera, a personal computer (PC), a server computer, a workstation, a laptop, a digital television, a set-top box, a music player, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A memory system comprising:
a memory module configured to generate density information of the memory module based on a number of bad pages of the memory module, the bad pages being pages that have a fault;
a memory controller configured to map a continuous physical address to a dynamic random access memory (dram) address of the memory module based on the density information received from the memory module; and
wherein when the memory module includes a memory device and the memory device includes a plurality of banks, the memory module is configured to generate the density information based on a maximum number, the maximum number being a number of the bad pages of one of the plurality of banks having a highest number of the bad pages among the plurality of banks.

2. The memory system of claim 1, wherein the density information is further based on a maximum number of the physical address, where the maximum number of the physical address is X−N*max(a), the X is a full address of the memory module, the N is a number of the plurality of banks, and the max(a) is the maximum number.

3. The memory system of claim 2, wherein the memory controller is configured to map the continuous physical address to a mapping sequence of the memory module, the mapping sequence being at least one of a row address, a bank address and a column address.

4. The memory system of claim 1, wherein the density information is further based on a maximum number of the physical address, where the maximum of the physical address is $$X - \sum_{i=1}^{N} ai,$$

the X is a full address of the memory module, the N is a number of the plurality of banks, and a1 to aN are numbers of the bad pages of the plurality of banks.

5. The memory system of claim 4, wherein the memory controller is configured to map the continuous physical address to a mapping sequence of the memory module, the mapping sequence being at least one of a bank address, a row address and a column address.

6. The memory system of claim 4, wherein the memory controller is configured to map the continuous physical address to the dram address by adding a page offset value corresponding to the number of the bad pages to the dram address.

7. The memory system of claim 1, wherein the memory module includes a plurality of memory devices, and
the density information is generated based on a maximum number, the maximum number being a number of the bad pages of one of the plurality of memory devices having a highest number of the bad pages among the plurality of memory devices.

8. The memory system of claim 7, wherein the density information is further based on a maximum number of the physical address, where the maximum of the physical address is X−M*max(Da), the X is a full address of the memory module, the M is a number of the plurality of memory devices, and the max(Da) is the maximum number of bad pages of the memory devices.

9. The memory system of claim 7, wherein the density information is further based on a maximum number of the physical address, where the maximum of the physical address is $$X - \sum_{i=1}^{M} Dai,$$

the X is a full address of the memory module, the M is a number of the plurality of memory devices, and the Da1 to DaM are numbers of the bad pages of the plurality of memory devices.

10. The memory system of claim 1, wherein the memory controller is further configured to output a maximum physical address to a processing architecture running an operating system.

11. A memory system comprising:
a memory module;
a memory controller and a processing architecture in communication with the memory module, at least one of the memory controller and the processing architecture configured to map a continuous physical address to the memory module based on memory density information of the memory module, the memory density information indicating bad pages of the memory module; and
wherein the memory module includes at least one memory device, the at least one memory device including at least one memory bank, and
the memory module is configured to generate the memory density information based on a maximum number, the maximum number being a number of the bad pages associated with one of the at least one memory bank having a highest number of the bad pages among the at least one memory bank.

12. The memory system of claim 11, wherein the memory module is configured to,
determine the bad pages from among pages of the memory module, the bad pages being pages that have a fault;
replace each of the bad pages with a normal page in the memory module;
generate the memory density information of the memory system based on a number of the determined bad pages; and
transmit the generated memory density information to at least one of the memory controller and the processing architecture.

13. The memory system of claim 12, wherein the processing architecture is configured to map the continuous physical address to the memory module by,
mapping a continuous virtual address to the physical address of the memory controller based on the generated memory density information, and
mapping the continuous physical address of the memory controller to an address of a cell array of the memory module.

14. The memory system of claim 11, wherein the at least one of the memory controller and the processing architecture is configured to map the continuous physical address to the address of the memory module by, determining an address of an unallocated area of the memory module based on the number of the bad pages, mapping an initial segment of the continuous physical address to an initial segment of the address of the unallocated area of at least two banks of the memory module in a parallel manner to the at least two banks of the memory module until reaching at least one bad area corresponding to at least one bad page of the memory module, skipping the at least one bad area, and mapping at least one further segment of the physical address to at least one further segment of the address of the unallocated area of the memory module.

15. The memory system of claim 14, wherein if the at least one bad area of the memory module is greater than one, the at least one of the memory controller and the processing architecture are further configured to repeat the skipping of the at least one bad area, and the mapping of at least one further segment, N times, where N is equal to the number of bad areas, or until reaching a maximum of the continuous physical address allowed to be mapped to the memory module.

16. The memory system of claim 15, wherein the memory controller is configured to determine the maximum of the continuous physical address allowed to be mapped to the memory module based on a full address of the memory module, a number of banks of the memory module and a maximum number, the maximum number being a number of the bad pages of one of the banks of the memory module having a highest number of the bad pages among the banks.

17. The memory system of claim 16, wherein the memory controller is configured to determine the maximum of the continuous physical address by subtracting from the full address, a result of multiplication of the number of banks and the maximum number.

* * * * *